US012787330B2

(12) United States Patent
Chang et al.

(10) Patent No.: US 12,787,330 B2
(45) Date of Patent: Nov. 3, 2026

(54) HIGH ELECTRON MOBILITY TRANSISTOR AND METHOD FOR MANUFACTURING THE SAME

(71) Applicant: NATIONAL YANG MING CHIAO TUNG UNIVERSITY, Hsinchu City (TW)

(72) Inventors: Edward Yi Chang, Hsinchu City (TW); Yueh-Chin Lin, Hsinchu City (TW); He-Yu Yang, Hsinchu City (TW); Howie Tseng, Hsinchu City (TW)

(73) Assignee: NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 355 days.

(21) Appl. No.: 18/539,580

(22) Filed: Dec. 14, 2023

(65) Prior Publication Data

US 2025/0072025 A1 Feb. 27, 2025

(30) Foreign Application Priority Data

Aug. 25, 2023 (TW) ................................ 112132022

(51) Int. Cl.
*H01L 29/423* (2006.01)
*H10D 30/01* (2025.01)
(Continued)

(52) U.S. Cl.
CPC ......... *H10D 30/015* (2025.01); *H10D 30/475* (2025.01); *H10D 62/8503* (2025.01); *H10D 64/411* (2025.01)

(58) Field of Classification Search
CPC ............... H10D 30/015; H10D 30/475; H10D 62/8503; H10D 64/411; H10D 64/01; H10D 64/518; H10D 30/47–485; H10P 76/403
See application file for complete search history.

(56) References Cited

U.S. PATENT DOCUMENTS 11,682,721 B2 * 6/2023 Dejarld ................ H10D 30/475 257/194
2014/0054598 A1 * 2/2014 Shim ................. H10D 62/8503 438/285

FOREIGN PATENT DOCUMENTS

JP 2006319122 A 11/2006
JP 7156586 B 10/2022
(Continued)

*Primary Examiner* — Cuong B Nguyen
(74) *Attorney, Agent, or Firm* — MUNCY, GEISSLER, OLDS & LOWE, P.C.

(57) ABSTRACT

A method for manufacturing a high electron mobility transistor (HEMT), which comprises the following steps: providing a substrate, wherein a semiconductor layer is formed on the substrate, and a source electrode and a drain electrode are formed on the semiconductor layer; forming a passivation layer on the source electrode and the drain electrode; etching the passivation layer to form a through hole between the source electrode and the drain electrode, wherein a region of the semiconductor layer is exposed through the through hole; forming a photoresist layer on the passivation layer, wherein a first sub-region of the region of the semiconductor layer is covered by the photoresist layer, and a second sub-region of the region of the semiconductor layer is not covered by the photoresist layer; forming a metal layer on the second sub-region to form a gate electrode; and removing the passivation layer.

14 Claims, 6 Drawing Sheets

(51) Int. Cl.
*H10D 30/47* (2025.01)
*H10D 62/85* (2025.01)
*H10D 64/27* (2025.01)

(56) References Cited

FOREIGN PATENT DOCUMENTS

| | | | |
|---|---|---|---|
| TW | 201137990 | A | 11/2011 |
| TW | 202121500 | A | 6/2021 |

* cited by examiner

HIGH ELECTRON MOBILITY TRANSISTOR AND METHOD FOR MANUFACTURING THE SAME

CROSS-REFERENCE TO RELATED APPLICATIONS

This application claims the benefits of the Taiwan Patent Application Serial Number 112132022, filed on Aug. 25, 2023, the subject matter of which is incorporated herein by reference.

BACKGROUND OF THE INVENTION

Field

The present invention relates to a high electron mobility transistor (HEMT) and a method for manufacturing the same. More specifically, the present invention relates to a HEMT with an I-shaped gate electrode and a method for manufacturing the same.

Description of Related Art

High electron mobility transistors (HEMTs) have the advantages of fast switching speed, high electron mobility, high breakdown power, and wide energy gap, and can be applied to high-voltage electronic components or high-frequency electronic components. It is currently known that electron beam lithography can be used to prepare HEMTs with the gate electrodes having small gate lengths.

The electron beam lithography process has been widely used in forming various patterned structures, and has the advantages of high resolution, high process reliability, high precision of positioning or alignment, and high flexibility of pattern reproduction, etc. However, the electron beam lithography process still has shortcomings, the main ones being long operation time and high cost.

Therefore, it is desirable to develop a novel process to improve the aforesaid shortcomings of the electron beam lithography process.

SUMMARY OF THE INVENTION

An object of the present invention is to provide a method for manufacturing an HEMT, which can effectively improve component manufacturing efficiency and reduce process costs.

The method for manufacturing the HEMT provided by the present invention comprises the following steps: providing a substrate, wherein a semiconductor layer is formed on the substrate, and a source electrode and a drain electrode are formed on the semiconductor layer; forming a passivation layer on the source electrode and the drain electrode; etching the passivation layer to form a through hole between the source electrode and the drain electrode, wherein a region of the semiconductor layer is exposed through the through hole; forming a photoresist layer on the passivation layer, wherein a first sub-region of the region of the semiconductor layer is covered by the photoresist layer, and a second sub-region of the region of the semiconductor layer is not covered by the photoresist layer; forming a metal layer on the second sub-region to form a gate electrode; and removing the passivation layer.

In the method of the present invention, the region of the gate electrode is defined by the shielding of the passivation layer and the photoresist layer, so as to prepare a HEMT with the gate electrode having the small gate length. In particular, the method of the present invention can improve the shortcomings of the electron beam lithography process, improve device manufacturing efficiency and reduce process costs.

In the method of the present invention, the method may further comprise a step of: forming a photoresist masking layer for etching on the passivation layer between the step of forming the passivation layer on the source electrode and the drain electrode and the step of etching the passivation layer. By forming the photoresist masking layer for etching, the through hole exposing the semiconductor layer can be defined, and the through hole is located between the source electrode and the drain electrode.

In the method of the present invention, the photoresist masking layer for etching and the photoresist layer used to define the deposition region of the metal layer can be formed using the same mask.

In the method of the present invention, a portion of the passivation layer adjacent to the second sub-region of the semiconductor layer (which is the region not covered by the photoresist layer) is not covered by the photoresist layer in the step of forming the photoresist layer on the passivation layer. In the method of the present invention, the metal layer is further formed on the portion of the passivation layer not covered by the photoresist layer in the step of forming the metal layer on the second sub-region of the semiconductor layer (which is the region not covered by the photoresist layer).

In the method of the present invention, the position of the gate electrode can be defined through two-stage exposure and development at different positions with the shielding of the passivation layer. In more detail, the exposure and development process at the first position can form the photoresist masking layer for etching to define the through hole exposing the semiconductor layer between the source electrode and the drain electrode. This is the first lithography process. The exposure and development process at the second position can form another photoresist layer to define the deposition region of the metal layer. This is the second lithography process. The exposure and development process of the first position and the second position can be performed using a stepper exposure machine. In addition, the second position is offset toward the source electrode or the drain electrode compared to the first position. Therefore, during the second lithography process, the first sub-region of the semiconductor layer exposed through the through hole can be covered by the photoresist layer, and the second sub-region of the semiconductor layer exposed through the through hole is not covered by the photoresist layer. Therefore, when the metal layer is formed, through the photoresist layer formed by the second lithography process and the shielding of the passivation layer, the metal layer can be deposited in the second sub-region of the semiconductor layer that is not covered by the photoresist layer to form a gate electrode.

Furthermore, when the mask used in the exposure and development process at the first position and the second position is the same mask, by shifting the second position toward the source electrode or the drain electrode compared to the first position, a portion of the passivation layer adjacent to the second sub-region of the semiconductor layer (which is the region not covered by the photoresist layer) is not covered by the photoresist layer, and the subsequently deposited metal layer can also be formed on the portion of the passivation layer that is not covered by the photoresist layer. When the passivation layer is subsequently removed, the metal layer deposited on the passivation layer can also be removed at the same time, leaving only the gate electrode of the metal layer located on the semiconductor layer.

In the method of the present invention, a thickness of the metal layer may be less than a thickness of the passivation layer. Therefore, when the subsequently deposited metal layer is simultaneously formed on the portion of the passivation layer that is not covered by the photoresist layer, the metal layer formed on the portion of the passivation layer and the metal layer serving as the gate electrode are not connected to each other. When the passivation layer is subsequently removed, the formed gate electrode will not be affected.

In one embodiment of the present invention, a difference between the thickness of the metal layer and the thickness of the passivation layer may range from 0.01 μm to 0.7 μm, for example, from 0.01 μm to 0.6 μm, 0.01 μm to 0.5 μm, 0.01 μm to 0.3 μm, 0.01 μm to 0.2 μm, 0.01 μm to 0.1 μm or 0.03 μm to 0.1 μm.

In the method of the present invention, the passivation layer may be etched by dry etching or wet etching to form the through hole between the source electrode and the drain electrode. In one embodiment of the present invention, the passivation layer may be etched using inductively coupled plasma (ICP) etching, but the present invention is not limited thereto. In one embodiment of the present invention, when etching the passivation layer, lateral etching may occur. At this time, an angle less than 90 degrees may be included between a side wall of the through hole and the exposed surface of the region of the semiconductor layer. For example, the angle may range from 40 degrees to 85 degrees, 50 degrees to 85 degrees or 60 degrees to 85 degrees, but the present invention is not limited thereto. The angle formed depends on the process or material (for example, the material of the passivation layer).

In the method of the present invention, the method may further comprise a step of: forming a protection layer covering the gate electrode, the source electrode, the drain electrode and the semiconductor layer after the step of removing the passivation layer to prevent moisture from penetrating into the components.

The present invention further provides an HEMT prepared by the aforementioned method, which comprises: a substrate; a semiconductor layer disposed on the substrate; a source electrode disposed on the semiconductor layer; a drain electrode disposed on the semiconductor layer; and a gate electrode disposed on the semiconductor layer and between the source electrode and the drain electrode, wherein the gate electrode has a bottom surface and a top surface opposite to the bottom surface, the bottom surface is a surface of the gate electrode contacting the semiconductor layer, and a width of the top surface is less than or equal to a width of the bottom surface.

In the HEMT of the present invention, the width of the top surface of the gate electrode is less than or equal to the width of the bottom surface of the gate electrode. Preferably, the width of the top surface of the gate electrode is substantially equal to the width of the bottom surface of the gate electrode, so the HEMT of the present invention is a HEMT with an I-shaped gate electrode. In one embodiment of the present invention, a difference between the width of the top surface of the gate electrode and the width of the bottom surface of the gate electrode may be less than or equal to 10 nm.

In the HEMT of the present invention, a gate length of the gate electrode may range from 0.05 μm to 0.5 μm, for example, from 0.05 μm to 0.4 μm, 0.1 μm to 0.4 μm or 0.1 μm to 0.3 μm. In one embodiment of the present invention, the gate length of the gate electrode may be about 0.2 μm.

In the present invention, the gate length of the gate electrode refers to the width of the gate electrode measured on the bottom surface of the gate electrode in the cross-sectional view of the HEMT.

The HEMT of the present invention may further comprise: a protection layer covering the gate electrode, the source electrode, the drain electrode and the semiconductor layer. The HEMT of the present invention may further comprise: a buffer layer disposed between the substrate and the semiconductor layer.

In the present invention, the substrate may be a rigid substrate or a flexible substrate. The material of the substrate may comprise quartz, glass, wafer, sapphire, resin, epoxy resin, polycarbonate (PC), polyimide (PI), polypropylene (PP), polyethylene terephthalate (PET), polymethylmethacrylate (PMMA), other plastic materials or a combination thereof, but the present invention is not limited thereto.

In the present invention, the semiconductor layer may comprise a GaN layer and an AlGaN layer. However, the present invention is not limited thereto, and other materials that can be used in HEMTs are also included in the present invention.

In the present invention, the photoresist masking layer for etching formed by the first lithography process and the photoresist layer formed by the second lithography process may be positive or negative photoresists respectively.

In the present invention, the material of the passivation layer, the protection layer and the buffer layer may respectively comprise silicon oxide, silicon nitride, silicon oxynitride, silicon carbonitride, silicon oxycarbide, aluminum oxide, or a combination thereof, and the passivation layer, the protection layer and the buffer layer may respectively have a single-layer or multi-layer structure. In one embodiment of the present invention, the passivation layer is a SiN layer. In one embodiment of the present invention, the protection layer is a SiN layer. However, the present invention is not limited thereto.

In the present invention, the material of the gate electrode (the metal layer), the source electrode and the drain electrode may respectively comprise indium (In), tin (Sn), aluminum (Al), gold (Au), platinum (Pt), zinc (Zn), germanium (Ge), silver (Ag), lead (Pb), palladium (Pd), copper (Cu), gold beryllium (AuBe), beryllium germanium (BeGe), nickel (Ni), lead tin (PbSn), chromium (Cr), gold zinc (AuZn), titanium (Ti), tungsten (W), titanium tungsten (TiW), an alloy thereof or a combination thereof. In addition, the gate electrode (the metal layer), the source electrode and the drain electrode may respectively have a single-layer or multi-layer structure.

In the present invention, the passivation layer, the protection layer, the buffer layer, the photoresist layer, the gate electrode (the metal layer), the source electrode and the drain electrode may be prepared using any appropriate method respectively. The appropriate method includes electroplating, chemical plating, chemical vapor deposition, sputtering, coating, photolithography or a combination thereof, but the present invention is not limited thereto. The coating method may be, for example, a dip coating method, a spin coating method, a roller coating method, a blade coating method, a spray coating method, or a combination of the above, but the present invention is not limited thereto.

Other novel features of the present invention will become more apparent from the following detailed description when taken in conjunction with the accompanying drawings.

DETAILED DESCRIPTION OF THE INVENTION

Figure 1A:
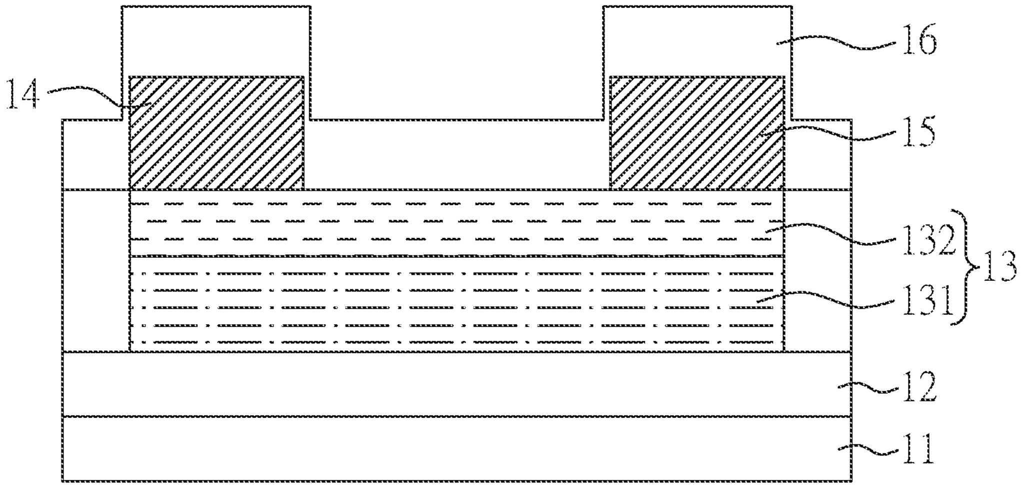
FIG. 1A to FIG. 1H show schematic cross-sectional views of a method for manufacturing an HEMT according to one embodiment of the present invention.

The following is specific embodiments to illustrate the implementation of the present invention. Those who are familiar with this technique can easily understand the other advantages and effects of the present invention from the content disclosed in the present specification. The present invention can also be implemented or applied by other different specific embodiments, and various details in the present specification can also be modified and changed according to different viewpoints and applications without departing from the spirit of the present invention.

It should be noted that, in the present specification, when a component is described to have an element, it means that the component may have one or more of the elements, and it does not mean that the component has only one of the element, except otherwise specified. Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

In the specification and the appended claims of the present invention, certain words are used to refer to specific elements. Those skilled in the art should understand that electronic device manufacturers may refer to the same components by different names. The present specification does not intend to distinguish between elements that have the same function but have different names. In the following description and claims, words such as "comprising", "including", "containing", and "having" are open-ended words, so they should be interpreted as meaning "containing but not limited to . . . ". Therefore, when the terms "comprising", "including", "containing" and/or "having" are used in the description of the present invention, they specify the existence of corresponding features, regions, steps, operations and/or components, but do not exclude the existence of one or more corresponding features, regions, steps, operations and/or components.

The terms, such as "about", "equal to", "equal" or "same", "substantially", or "approximately", are generally interpreted as within 10%, 5%, 3%, 2%, 1%, or 0.5% of a given value or range. The quantity given here is an approximate quantity, that is, without specifying "about", "approximately", "substantially" and "approximately", "about", "approximately", "substantially" and "approximately" can still be implied. Furthermore, when a value is "in a range from a first value to a second value" or "in a range between a first value and a second value", the value can be the first value, the second value, or another value between the first value and the second value.

In the present specification, except otherwise specified, the terms (including technical and scientific terms) used herein have the meanings generally known by a person skilled in the art. It should be noted that, except otherwise specified, in the embodiments of the present invention, these terms (for example, the terms defined in the generally used dictionary) should have the meanings identical to those known in the art, the background of the present invention or the context of the present specification, and should not be read by an ideal or over-formal way.

In addition, relative terms such as "below" or "under" and "on", "above" or "over" may be used in the embodiments to describe the relative relationship between one element and another element in the drawings. It will be understood that if the device in the drawing was turned upside down, elements described on the "lower" side would then become elements described on the "upper" side. When a unit (for example, a layer or a region) is referred to as being "on" another unit, it can be directly on the another unit or there may be other units therebetween. Furthermore, when a unit is said to be "directly on another unit", there is no unit therebetween. Moreover, when a unit is said to be "on another unit", the two have a top-down relationship in a top view, and the unit can be disposed above or below the another unit, and the top-bottom relationship depends on the orientation of the device.

In the present invention, the distance and the thickness may be measured by using an optical microscope or by a cross-sectional image in an electron microscope, but the present invention is not limited thereto. Furthermore, any two values or directions used for comparison may have certain errors. If the first value is equal to the second value, it implies that there may be an error of about 10% between the first value and the second value.

FIG. 1A to FIG. 1H show schematic cross-sectional views of a method for manufacturing an HEMT according to one embodiment of the present invention.

As shown in FIG. 1A, first, a substrate 11 is provided, wherein a semiconductor layer 13 is formed on the substrate 11, and a source electrode 14 and a drain electrode 15 are formed on the semiconductor layer 13. In the present embodiment, a buffer layer 12 is further disposed between the substrate 11 and the semiconductor layer 13. In addition, the semiconductor layer 13 comprises a GaN layer 131 and an AlGaN layer 132 disposed on the GaN layer 131. Furthermore, the source electrode 14 and the drain electrode 15 are respectively a Ti/Al/Ni/Au metal layer, and the thicknesses of the Ti layer, the Al layer, the Ni layer and the Au layer are respectively 20 nm, 120 nm, 25 nm and 100 nm, but the present invention is not limited thereto. Thus, the preparation of the ohmic contact of the component is completed and the active area is defined.

Next, a passivation layer 16 is formed on the source electrode 14 and the drain electrode 15. Herein, the passivation layer 16 can be formed using a plasma-enhanced chemical vapor deposition system (PECVD), wherein the passivation layer 16 is a SiN layer and a thickness thereof ranges from 250 nm to 800 nm. In the present embodiment, the thickness of the passivation layer 16 is about 250 nm.

Figure 1B:
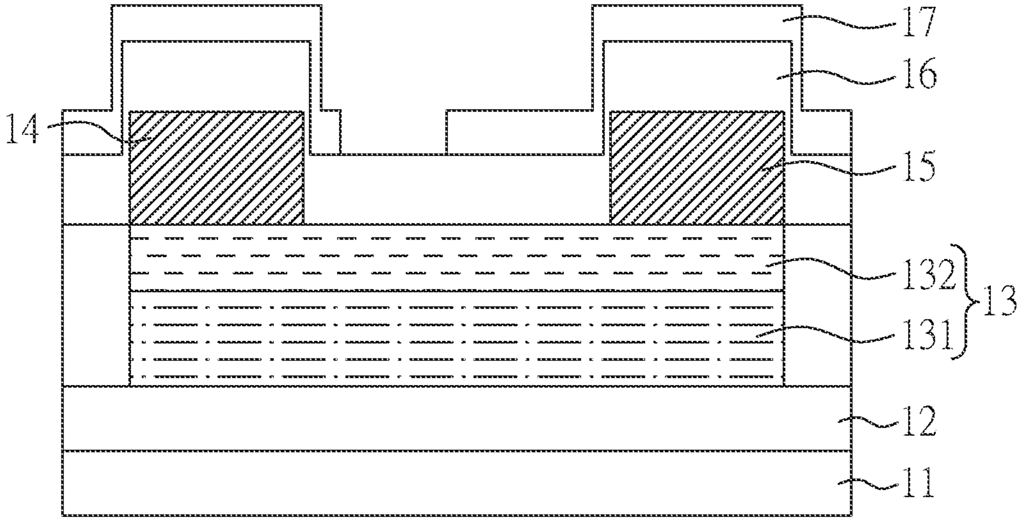

As shown in FIG. 1B, a photoresist masking layer 17 for etching is formed on the passivation layer 16. Herein, a stepper exposure machine can be used to perform the first lithography process to define the region of the gate electrode.

Figure 1C:
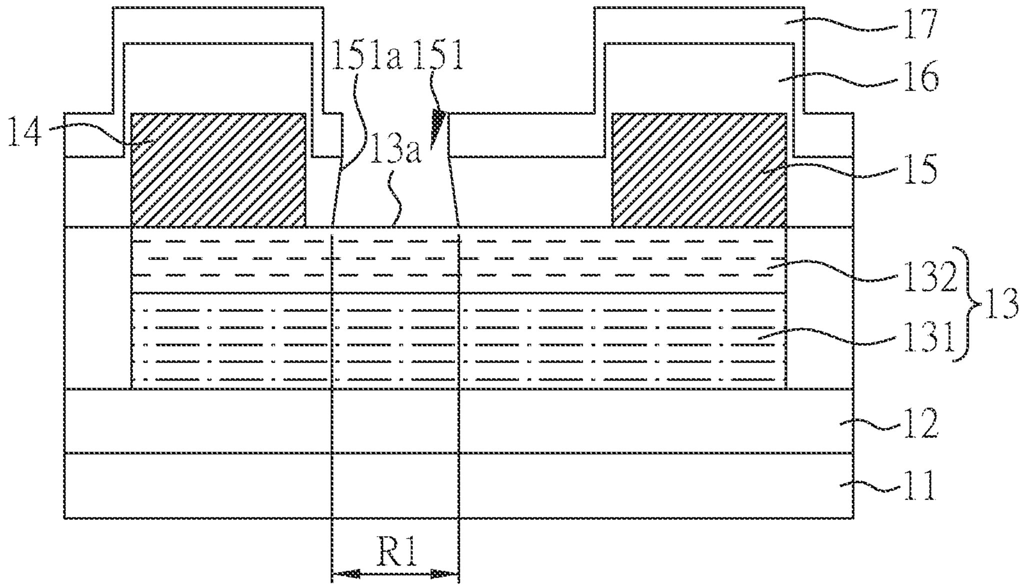
Figure 1D:
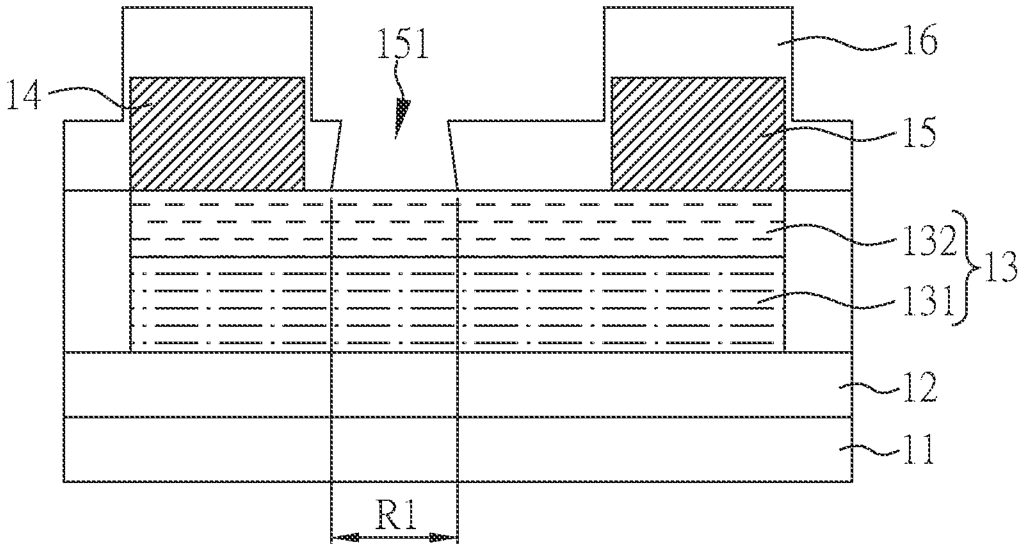

As shown in FIG. 1C, the passivation layer 16 is etched to form a through hole 151 between the source electrode 14 and the drain electrode 15, and a region R1 of the semiconductor layer 13 is exposed through the through hole 151. Herein, inductively coupled plasma (ICP) dry etching can be used to etch the passivation layer 16 to create the region R1 where the metal of the gate electrode can contact the semiconductor layer 13. In addition, an angle less than 90 degrees is included between a side wall 151*a* of the through hole 151 and a surface 13*a* of the region R1 of the semiconductor layer 13. Then, the photoresist masking layer 17 for etching is removed, as shown in FIG. 1D.

Figure 1E:
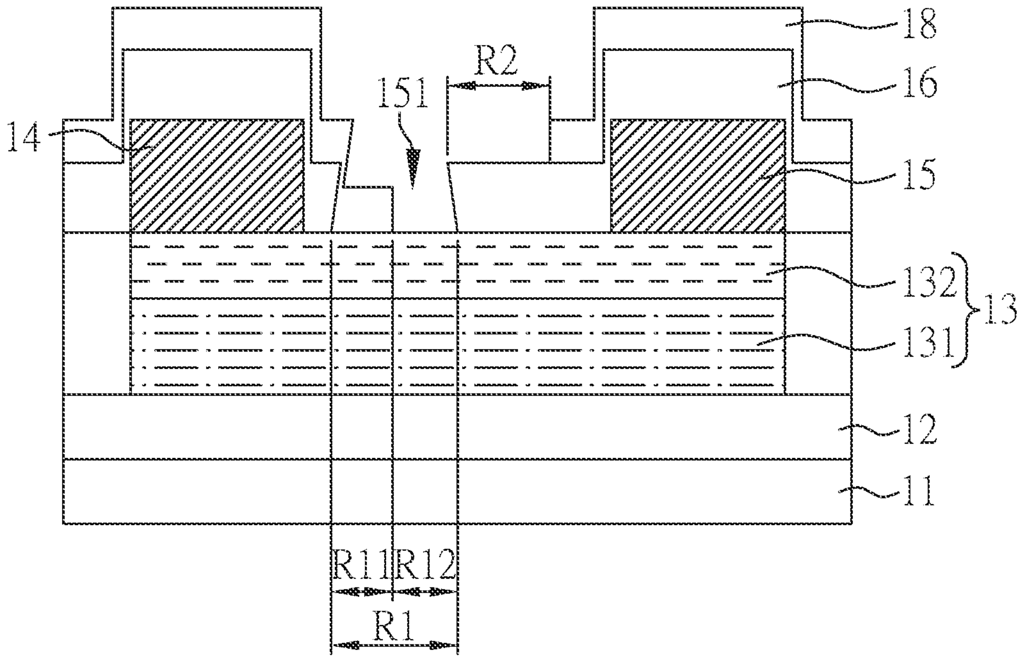

As shown in FIG. 1E, the pattern of the mask is shifted toward the drain electrode 15, and a second photolithography process is performed to form a photoresist layer 18 on the passivation layer 16. Here, the photoresist masking layer 17 for etching (shown in FIG. 1C) formed in the first lithography process and the photoresist layer 18 formed in the second lithography process can be formed using the same mask. After the second lithography process, a first sub-region R11 of the region R1 of the semiconductor layer 13 is covered by the photoresist layer 18, and a second sub-region R12 of the region R1 of the semiconductor layer 13 is not covered by the photoresist layer 18. In addition, a portion R2 of the passivation layer 16 adjacent to the second sub-region R12 is not covered by the photoresist layer 18.

As shown in FIG. IF, a metal layer 19 is formed on the second sub-region R12 to form a gate electrode 191. In addition, another portion 192 of the metal layer 19 is further formed on the portion R2 of the passivation layer 16 not covered by the photoresist layer 18 (as shown in FIG. 1E). In the present embodiment, the metal layer 19 is a Ni/Au metal layer, and the thicknesses of the Ni layer and the Au layer are respectively 50 nm and 150 nm, but the present invention is not limited thereto.

In the present embodiment, a stepper exposure machine is used to perform the first lithography process and the second lithography process. By shifting the pattern of the mask toward the drain electrode 15 (in other embodiments of the present invention, the pattern of the mask may be shifted toward the source electrode 14), the overlapping region between the second lithography region and the first etching region is the region of the gate electrode 191.

Figure 1F:
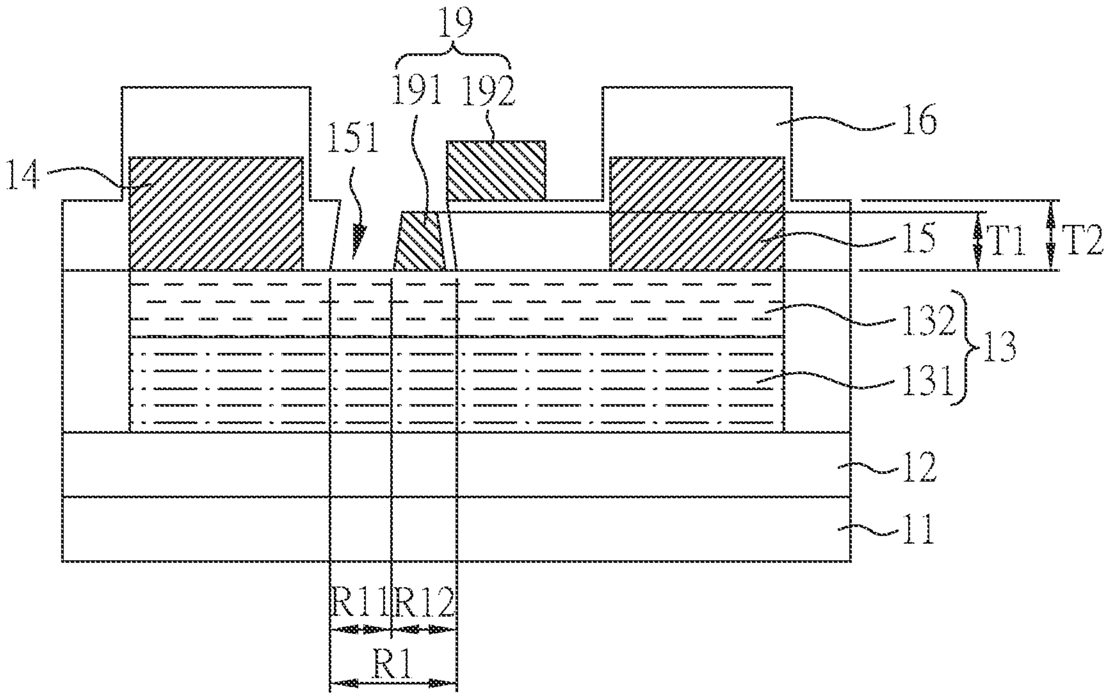
Figure 1G:
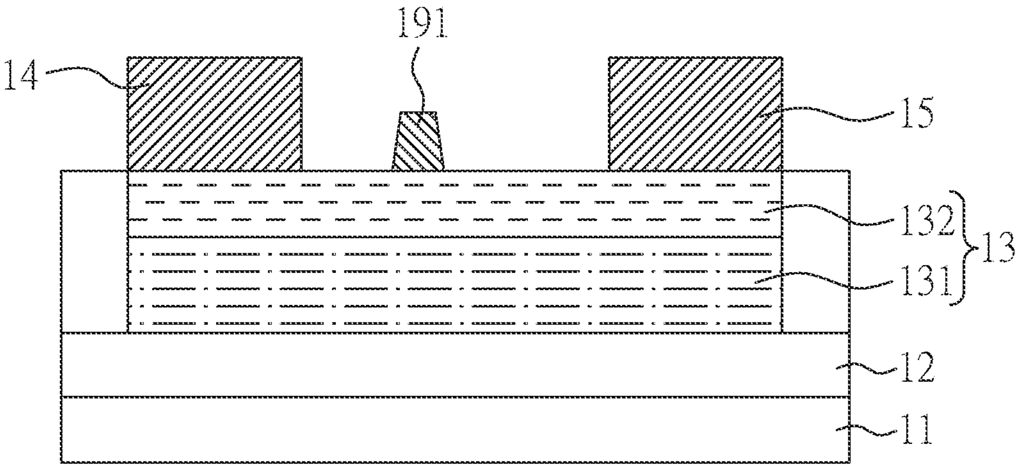

As shown in FIG. 1F and FIG. 1G, the passivation layer 16 is removed. In the present embodiment, using the shielding of the passivation layer 16, another portion 192 of the metal layer 19 deposited on the passivation layer 16 is removed together with the passivation layer 16 using a HF solution. In addition, the thickness T1 of the metal layer 19 is less than the thickness T2 of the passivation layer 16, so the metal layer 19 can be divided into two non-connected pieces (for example, the gate electrode 191 and the portion 192) during deposition, to facilitate the removal of the redundant portion 192 of the metal layer 19 on the passivation layer 16. Herein, the difference between the thickness T1 of the metal layer 19 and the thickness T2 of the passivation layer 16 can be adjusted according to the needs, for example, may range from 0.01 μm to 0.7 μm.

Figure 1H:
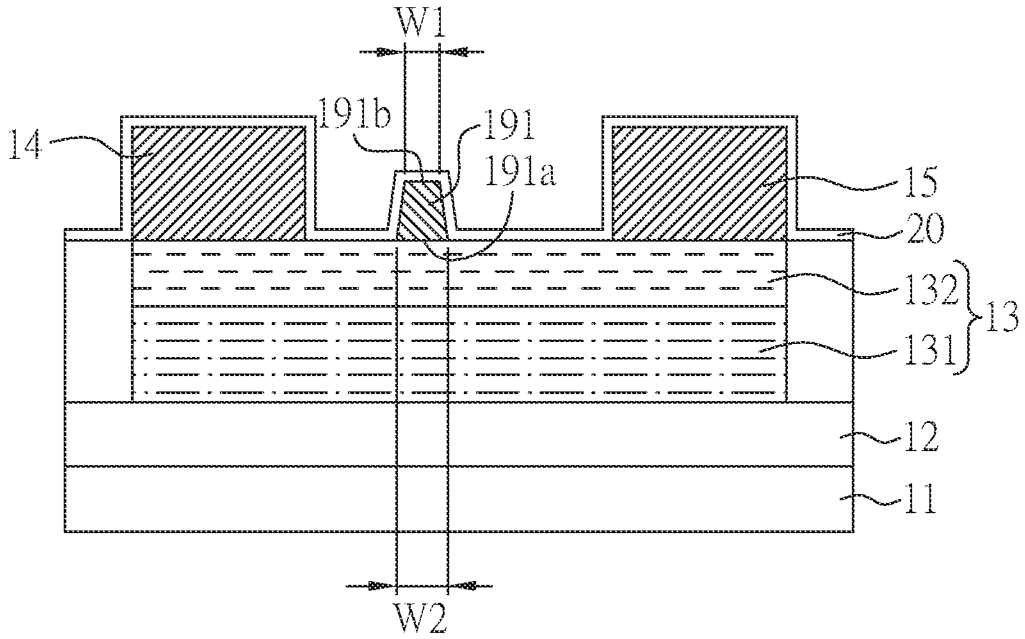

As shown in FIG. 1H, a protection layer 20 is formed, which covers the gate electrode 191, the source electrode 14, the drain electrode 15 and the semiconductor layer 13. In the present embodiment, a SiN layer with a thickness of 100 nm can be deposited as the protection layer 20 to cover the surfaces of the gate electrode 191, the source electrode 14, the drain electrode 15 and the semiconductor layer 13, but the present invention is not limited thereto.

As shown in FIG. 1H, after the aforesaid process, the HEMT of the present embodiment can be obtained, which comprises: a substrate 11; a semiconductor layer 13 disposed on the substrate 11; a source electrode 14 disposed on the semiconductor layer 13; a drain electrode 15 disposed on the semiconductor layer 13; and a gate electrode 191 disposed on the semiconductor layer 13 and located between the source electrode 14 and the drain electrode 15. In addition, the HEMT of the present embodiment further comprises: a protection layer 20 covering the gate electrode 191, the source electrode 14, the drain electrode 15 and the semiconductor layer 13.

Herein, the semiconductor layer 13 comprises a GaN layer 131 and an AlGaN layer 132 disposed on the GaN layer 131. In addition, the gate electrode 191 has a bottom surface 191*a* and a top surface 191*b* opposite to the bottom surface 191*a*, and the bottom surface 191*a* is a surface of the gate electrode 191 contacting the semiconductor layer 13. The width W1 of the top surface 191*b* is less than or equal to the width W2 of the bottom surface 191*a*, and for example, the difference between the width W1 of the top surface 191*b* and the width W2 of the bottom surface 191*a* is less than or equal to 10 nm. In the present embodiment, the width W1 of the top surface 191*b* and the width W2 of the bottom surface 191*a* are substantially the same. Furthermore, the gate length of the gate electrode 191 may range from 0.05 μm to 0.5 μm, wherein the gate length of the gate electrode 191 is the width W2 of the bottom surface 191*a*. In the present embodiment, the gate length of the gate electrode 191 is about 0.2 μm.

Herein, the electrical properties of the HEMT prepared in the above embodiment are measured.

Figure 2:
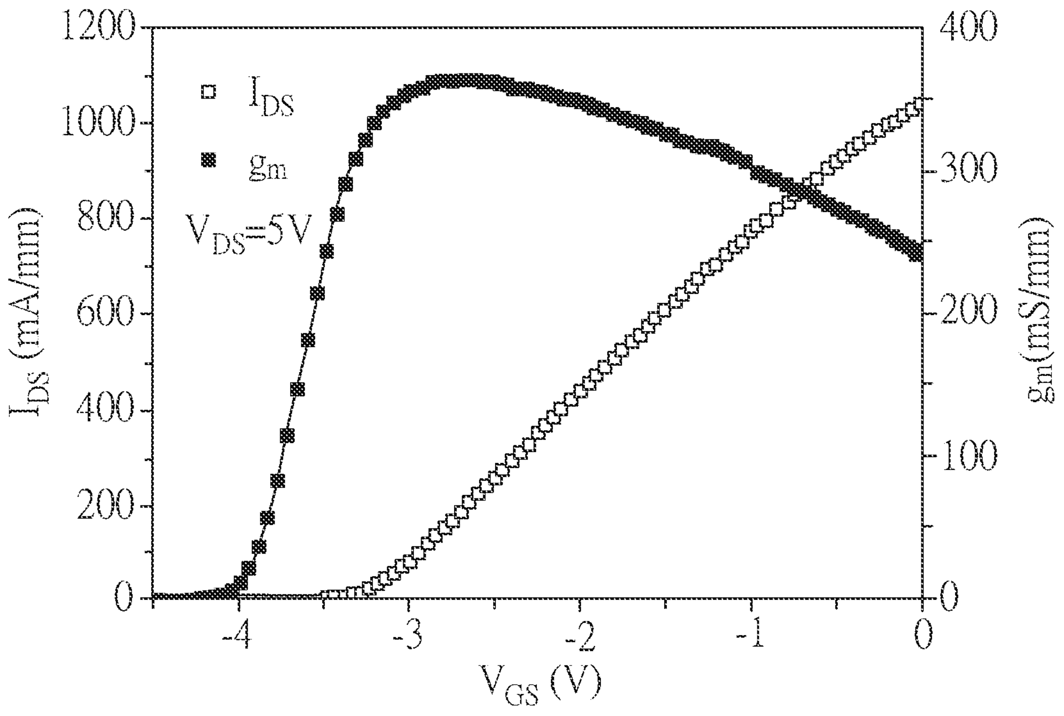
FIG. 2 shows the DC characteristics of a HEMT according to one embodiment of the present invention.

FIG. 2 shows the DC characteristics of a HEMT according to one embodiment of the present invention. It can be seen from the figure that the steady-state current density ($I_{dss}$) of the HEMT of the present invention can reach 1050 mA/mm, and the maximum transconductance ($g_{m,max}$) can reach 365 mS/mm.

Figure 3:
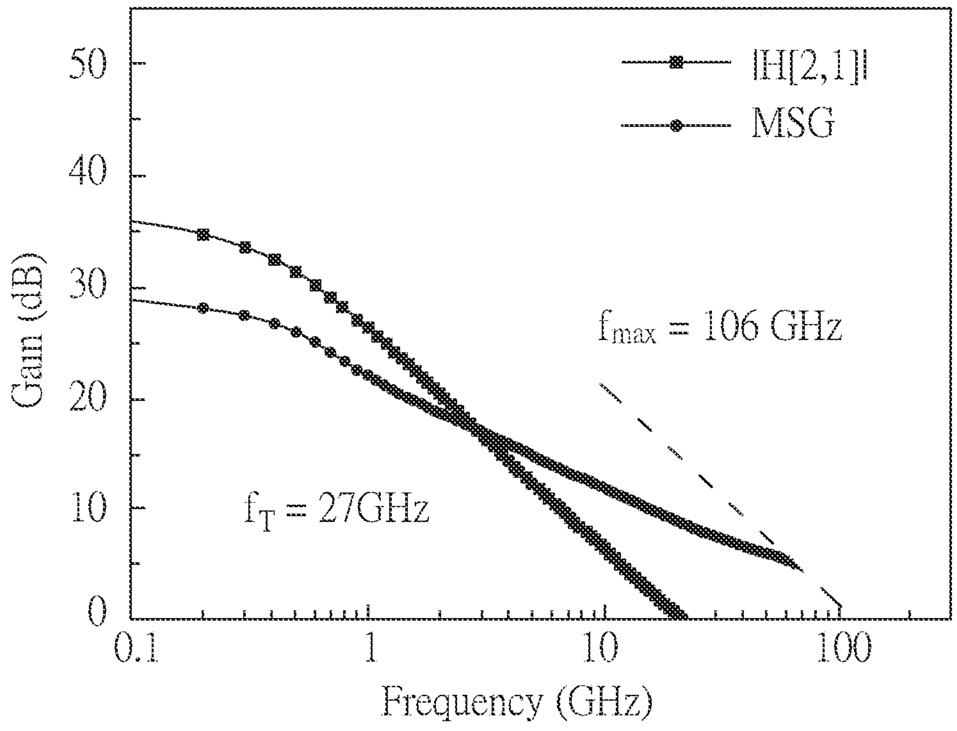
FIG. 3 shows the high-frequency characteristics of a HEMT according to one embodiment of the present invention.

FIG. 3 shows the high-frequency characteristics of a HEMT according to one embodiment of the present invention. It can be seen from the figure that the cut-off frequency ($f_T$) of the HEMT of the present invention can reach 27 GHz, and the maximum oscillation frequency ($f_{max}$) can reach 106 GHz.

Figure 4:
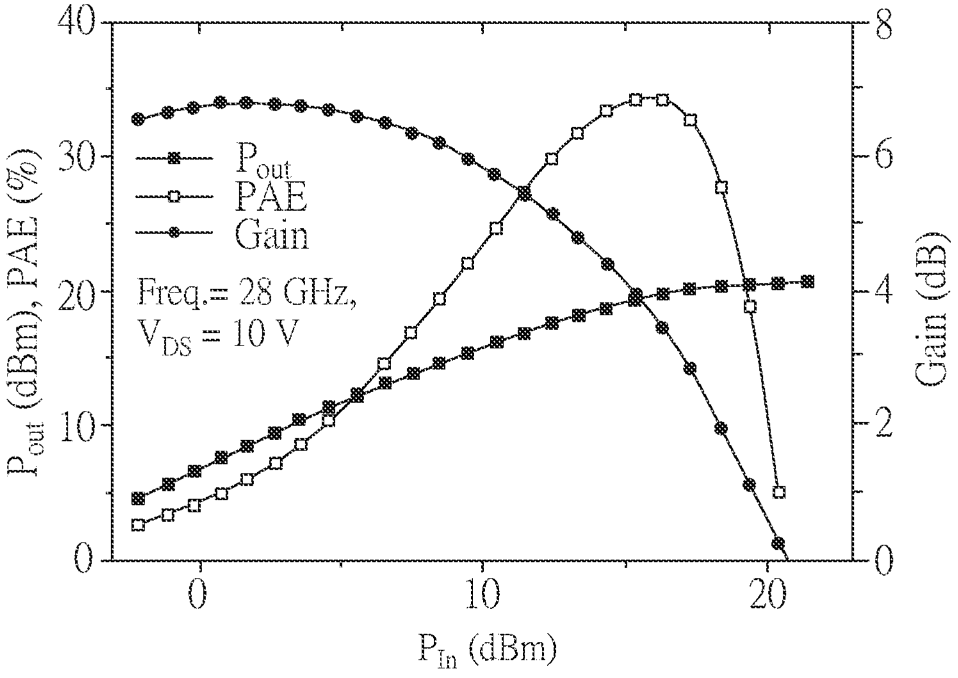
FIG. 4 shows the load-pull measurement results of a HEMT according to one embodiment of the present invention.

FIG. 4 shows the load-pull measurement results of a HEMT according to one embodiment of the present invention. It can be seen from the figure that the power-added efficiency (PAE) of the HEMT of the present invention can reach 34.23%, and the maximum output power density ($P_{out,max}$) can reach 2.39 W/mm.

Although the traditional electron beam lithography process can expose smaller gate lengths with higher precision, it has the disadvantages of high time consumption and high cost. As mentioned above, the present invention uses a lower-cost stepper exposure machine to perform two-stage exposure by shifting the exposure position. The overlapping region of the two exposures is used as the region of the gate electrode, and the gate length of the gate electrode can further be reduced. At the same time, the present invention increases the thickness of the passivation layer, so that when the metal of the gate electrode is deposited, it can be divided into two non-connected pieces above and below the passivation layer. Thus, the success rate of forming the gate electrode structure is improved, and the height tolerance of the metal of the gate electrode can be increased through the increased thickness of the passivation layer. In addition, through the structure of the gate electrode produced by the present invention, silicon nitride does not need to be used below the gate electrode to improve mechanical stability, which can further reduce parasitic capacitance.

Although the present invention has been explained in relation to its embodiment, it is to be understood that many other possible modifications and variations can be made without departing from the spirit and scope of the invention as hereinafter claimed.

The invention claimed is:

1. A method for manufacturing a high electron mobility transistor, comprising steps of:

providing a substrate, wherein a semiconductor layer is formed on the substrate, and a source electrode and a drain electrode are formed on the semiconductor layer;

forming a passivation layer on the source electrode and the drain electrode;

etching the passivation layer to form a through hole between the source electrode and the drain electrode, wherein a region of the semiconductor layer is exposed through the through hole;

forming a photoresist layer on the passivation layer, wherein a first sub-region of the region of the semiconductor layer is covered by the photoresist layer, and a second sub-region of the region of the semiconductor layer is not covered by the photoresist layer;

forming a metal layer on the second sub-region of the region of the semiconductor layer to form a gate electrode; and removing the passivation layer.

2. The method of claim 1, wherein the semiconductor layer comprises a GaN layer and an AlGaN layer.

3. The method of claim 1, wherein the passivation layer is a SiN layer.

4. The method of claim 1, wherein a thickness of the metal layer is less than a thickness of the passivation layer.

5. The method of claim 4, wherein a difference between the thickness of the metal layer and the thickness of the passivation layer ranges from 0.01 μm to 0.7 μm.

6. The method of claim 1, wherein a gate length of the gate electrode ranges from 0.05 μm to 0.5 μm.

7. The method of claim 1, wherein the gate electrode has a bottom surface and a top surface opposite to the bottom surface, the bottom surface is a surface of the gate electrode contacting the semiconductor layer, and a width of the top surface is less than or equal to a width of the bottom surface.

8. The method of claim 7, wherein a difference between the width of the top surface and the width of the bottom surface is less than or equal to 10 nm.

9. The method of claim 1, wherein an angle less than 90 degrees is included between a side wall of the through hole and a surface of the region of the semiconductor layer.

10. The method of claim 1, further comprising a step of: forming a protection layer covering the gate electrode, the source electrode, the drain electrode and the semiconductor layer after the step of removing the passivation layer.

11. The method of claim 1, further comprising a step of: forming a photoresist masking layer for etching on the passivation layer between the step of forming the passivation layer on the source electrode and the drain electrode and the step of etching the passivation layer.

12. The method of claim 11, wherein a mask for forming the photoresist masking layer for etching and a mask for forming the photoresist layer are the same.

13. The method of claim 1, wherein a portion of the passivation layer adjacent to the second sub-region of the region of the semiconductor layer is not covered by the photoresist layer in the step of forming the photoresist layer on the passivation layer.

14. The method of claim 13, wherein the metal layer is further formed on the portion of the passivation layer not covered by the photoresist layer in the step of forming the metal layer on the second sub-region of the region of the semiconductor layer.

* * * * *